United States Patent
Yu et al.

(10) Patent No.: US 6,385,073 B1
(45) Date of Patent: May 7, 2002

(54) INTEGRATED CIRCUIT DEVICE WITH EXPANDABLE NONVOLATILE MEMORY

(75) Inventors: Yueh-O Yu, Hsin-Chu; Chun-An Tang, Yun-Lin, both of (TW)

(73) Assignees: GC Technology Inc., Cupertino, CA (US); Lan Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/675,106

(22) Filed: Sep. 28, 2000

(30) Foreign Application Priority Data

Apr. 28, 2000 (TW) .................................. 089207124

(51) Int. Cl.[7] .............................................. G11C 5/02
(52) U.S. Cl. ....................... 365/51; 365/52; 365/185.05; 365/185.33
(58) Field of Search ............................. 365/185.25, 51, 365/52, 185.05, 185.33, 185.23

(56) References Cited

U.S. PATENT DOCUMENTS 4,447,881 A * 5/1984 Brantingham et al. ........ 716/17
5,357,473 A * 10/1994 Mizuno et al. ............. 365/201
5,995,718 A * 11/1999 Hiraike et al. ............. 358/1.11

* cited by examiner

Primary Examiner—David Nelms
Assistant Examiner—Gene N. Auduong
(74) Attorney, Agent, or Firm—Thomas, Kayden, Horstemeyer & Risley

(57) ABSTRACT

Disclosed is an integrated circuit device with expandable nonvolatile memory characterized in that a control unit and a voltage generator for memory operation are independently integrated into a common circuit instead of included in each single integrated circuit memory device and shared by at least one integrated circuit memory device. Therefore, multiple circuits such as control urn its and voltage generators and the chip area they occupy in each single integrated circuit memory device are reduced, so that not only the chip size and fabrication cost of the integrated circuit memory devices are decreased, but also the memory capacity is more flexible and adaptive for various applications.

36 Claims, 7 Drawing Sheets

INTEGRATED CIRCUIT DEVICE WITH EXPANDABLE NONVOLATILE MEMORY

FIELD OF THE INVENTION

The present invention relates generally to a nonvolatile semiconductor memory, and more particularly, to an integrated circuit (IC) device with expandable nonvolatile memory.

BACKGROUND OF THE INVENTION

Along with the development of compact electronic products, nonvolatile memories have been widely used. FIG. 1 shows a structure of a nonvolatile memory such as a conventional flash memory, electrically erasable programmable read only memory (EEPROM) and multi-time programming (MTP) memory. It includes a nonvolatile memory circuit 10, a control unit 22 and a voltage generator 24, in which the nonvolatile memory circuit 10 comprises a memory array 11 for data storage, an X decoder and driver 12 and a Y decoder and driver 13 for memory unit selection, a Y pass gate 14 for control of accessing data in the memory array 11, a sense amplifier and programming circuit 15 for reading and writing data, and an input/output (I/O) buffer 16 to serve as an interface between the memory and exterior. The control unit 22 generates various signals for the memory when data reading and memory programming and erasing. In addition, the control unit 22 transmits various corresponding signals to the programming circuit on the basis of the sense amplifier in programming and erasing operations. In response to program, erase and correction operations, the voltage generator 24 generates various corresponding voltages such as +10 V,–10 V,+5 V, etc., which can be generated by a voltage rising circuit or a voltage divider.

The memory capacity of a nonvolatile memory IC is fixed. A higher capacity means more advanced fabrication technique, lower yield and higher cost. Multiple nonvolatile ICs are therefore connected in series for the requirement of a higher memory capacity. However, waste is also occurred for such circumstances. Only the control unit and voltage generator of the selected nonvolatile memory IC are in operation when reading data or in programming. For example, in the operation of programming, data are sequentially, written into memory units and the memory units are also sequentially verified, that is, not all control units and voltage generators in a group of serial nonvolatile memory ICs are in operation at the same time. As a result, such multiple circuits in a group of serial nonvolatile memory ICs are wasteful, and become more significant with the increment of serial ICs. In the case where control units 22 and voltage generators 24 occupy a lager portion of chip area, decrease in the number of the wasteful circuits can reduce the chip size and its fabrication cost.

On the other hand, in an IC including nonvolatile memories, for instance in a microcontroller or microcomputer, various memory capacities are requested for different applications. It is therefore necessary to fabricate microcontrollers or microcomputers in a specific type with nonvolatile memories of different capacities adaptively for different applications. Contrarily, various applications can be obtained in reduced cost if a microcontroller or microcomputer is employed adaptively in connection with external nonvolatile memory ICs in which control units and voltage generators are removed from each single nonvolatile memory IC.

SUMMARY OF THE INVENTION

It is therefore an object of the present invention to disclose an expandable nonvolatile memory device.

Another object of the present invention is to provide an IC device with expandable nonvolatile memory to overcome the shortcomings of advanced technique, low yield and high cost due to high memory capacity.

According to the present invention, a semiconductor device comprises at least one nonvolatile memory IC in which the control unit and voltage generator for the memory operation are independently integrated into a common circuit and shared by all nonvolatile memory ICs.

In one aspect of the present invention, multiple circuits and the chip area they occupy in an IC device with expandable nonvolatile memory can be reduced.

In another aspect of the present invention, flexibility is obtained for the memory expansion in an IC device.

Standardizations of IC devices with nonvolatile memory are available for various applications according to the present invention.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION

Figure 1:
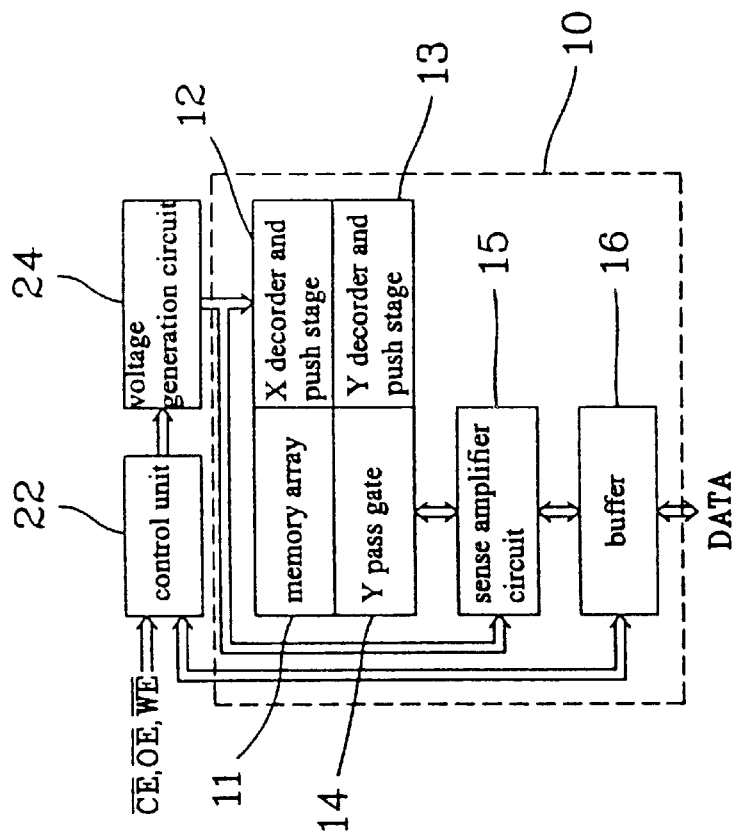
FIG. 1 is an illustration to show a conventional structure of a nonvolatile memory IC device.

The present invention is characterized in that a control unit and a voltage generator for memory operation of at least one nonvolatile memory IC are independently integrated into a common circuit and shared by all nonvolatile memory ICs, thereby expansion and flexibility of memory capacity in the manner of simplified circuits and reduced chip area are available. The control unit and voltage generator can be independently integrated in various manners. FIG. 2 shows an embodiment of the present invention that includes a common circuit 30 and a group of serial nonvolatile memory ICs 40a–x. The common circuit 30 comprises a control unit 32 and a voltage generator 34 for operations of each of the nonvolatile memory ICs 40a–x. Each of the nonvolatile memory ICs 40a–x comprises a nonvolatile memory circuit 44 which includes a memory array, an X decoder and driver, a Y decoder and driver, a Y pass gate, a sense amplifier and programming circuit, and an I/O buffer as the nonvolatile memory circuit 10 shown in FIG. 1. In addition, each of the nonvolatile memory ICs 40a–x further comprises a simple control circuit to perform simple logic functions, while the other control circuits for nonvolatile memories such as state machine and the like are contained in the control unit 32. The control unit 32 is connected to control circuit 42 in each of the nonvolatile memory ICs 40a–x with a selection circuit 36.

Figure 2:
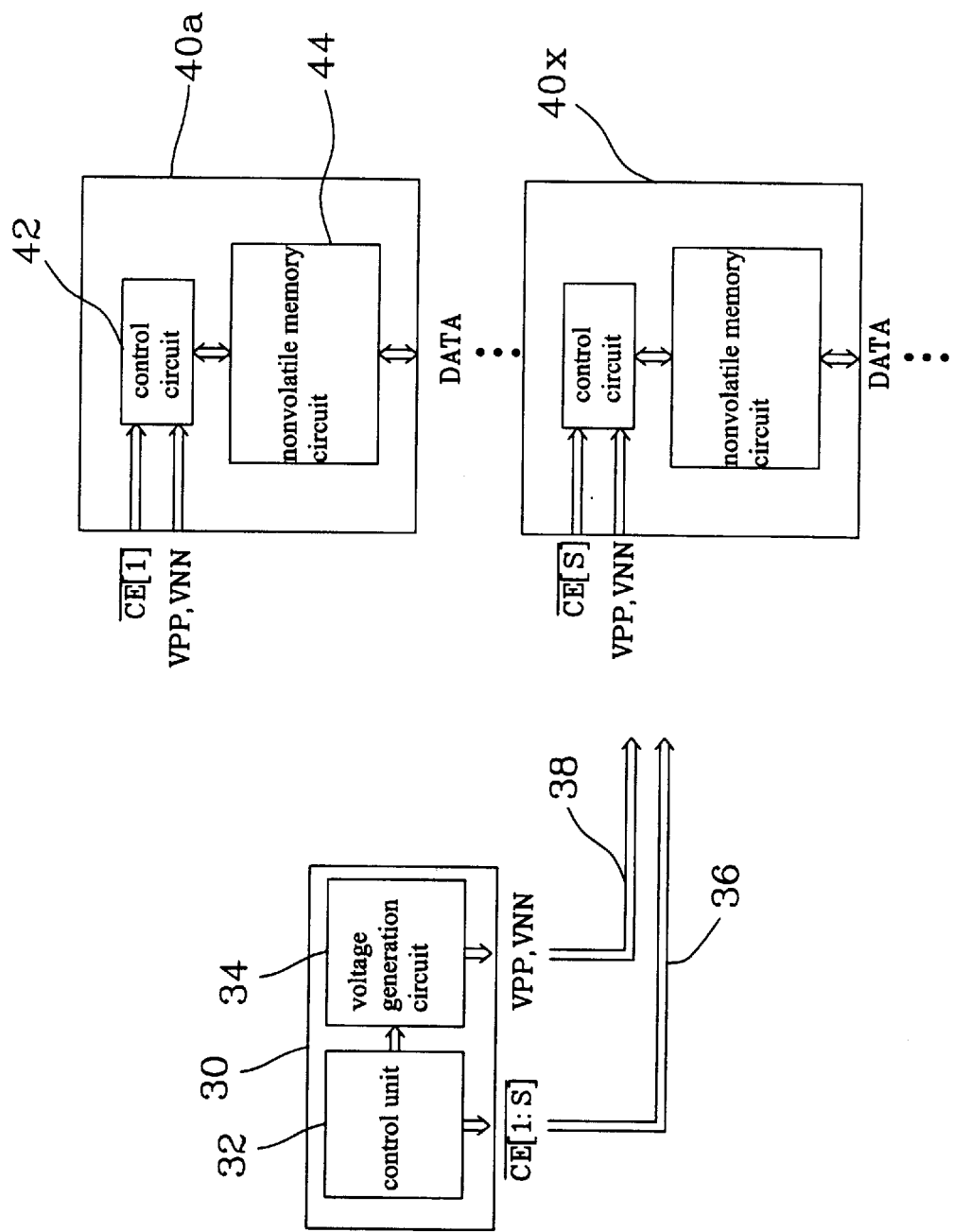
FIG. 2 is a view showing an expandable memory embodiment according to the present invention.

A major difference between the device shown in FIG. 2 and the conventional nonvolatile memory shown in FIG. 1 resides in that the control unit 32 and the voltage generator 34 are separated from each single nonvolatile memory IC and shared by the nonvolatile memory ICs 40a–x. Namely, each of the nonvolatile memory ICs 40a–x does not have its own control unit and voltage generator thereof for memory operations. The control unit 32 provides control circuits and generates various signals for each nonvolatile memory circuit 44 in the nonvolatile memory ICs 40a–x when they are in operation, i.e., the control unit 32 generates these signals for the nonvolatile memory circuits 44 to read data, program and erase the memory, and transmits corresponding signals to the programming circuit on the basis of the sense amplifier when the nonvolatile memory circuits 44 perform programming and erasing operations. While the voltage generator 34 generates various voltages in association with programming and erasing operations of the nonvolatile memory circuits 44, and delivers the voltages to the nonvolatile memory ICs 40a–x by a voltage path 38.

Further in this embodiment, the control unit 32 selects one of the nonvolatile memory ICs 40a–x with a parallel selection signal CE[1:S] by a selection circuit 36. Each of the nonvolatile memory ICs 40a–x is connected with one wiring among of the selection circuit 36 to be enabled by the selection signal. Generally, the selection circuit 36 and the voltage path 38 are the wirings or traces on the printed circuit board (PCB) mounted with the nonvolatile memory ICs 40a–x.

The control unit 32 and all the I/O buffers in the nonvolatile memory ICs 40a–x are connected by an external data bus (not shown) to transmit data signal DATA.

The device shown in FIG. 2 has a flexible memory capacity. When a larger capacity is needed, only an addition of the nonvolatile memory IC chips is required. In comparison with the conventional devices, the multiple circuits such as control units and voltage generators and the chip area they occupy in the device are therefore remarkably decreased, since the control unit 32 and voltage generator 34 are separated from each single nonvolatile memory IC chip and shared by all the nonvolatile memory ICs 40a–x, and it is more significantly advantageous with the increment of memory chips.

Figure 3:
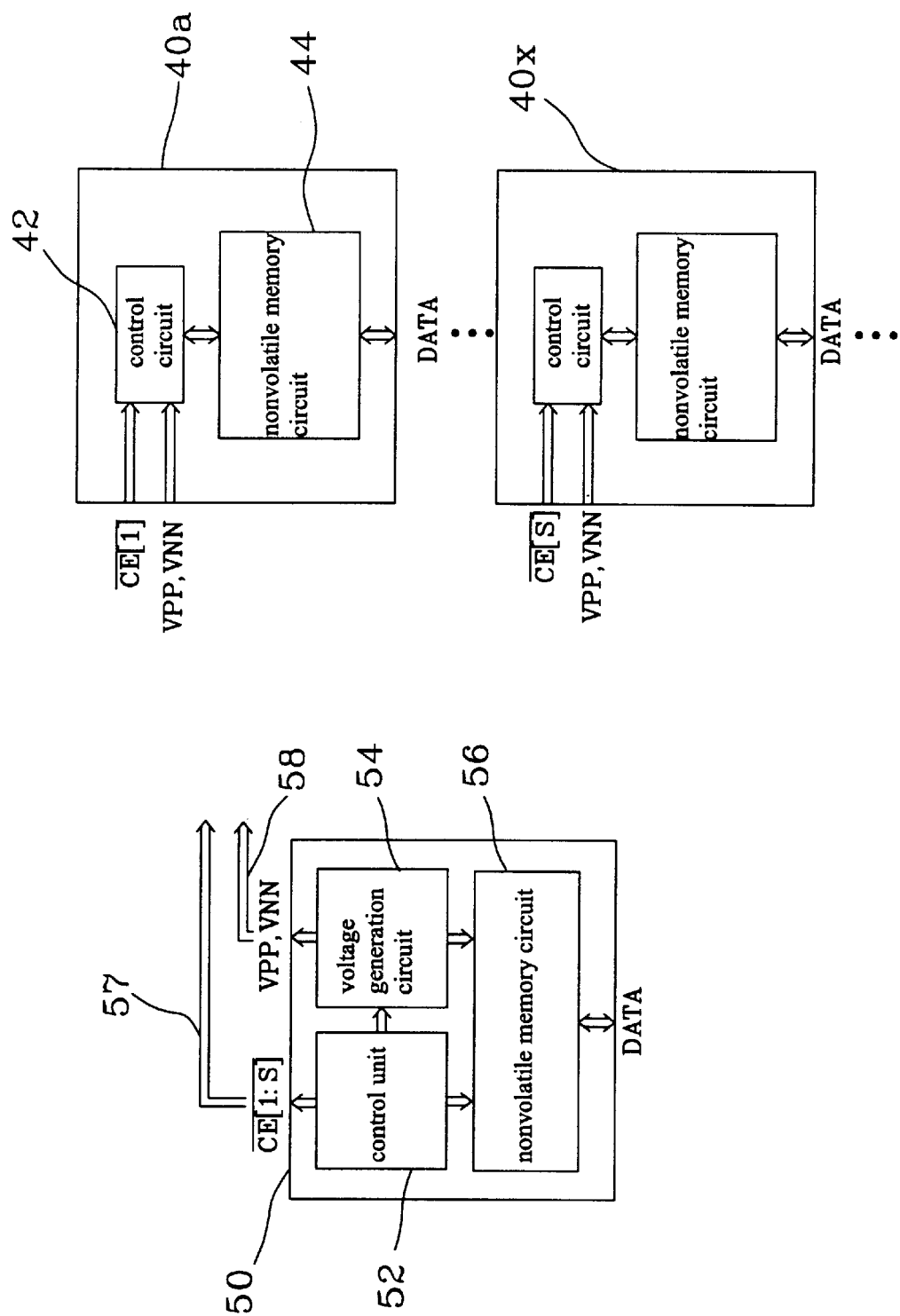
FIG. 3 shows another embodiment of the present invention in which a complete nonvolatile memory has a plurality of pins for memory expansion and a control unit and a voltage generator thereof to be shared by other serial nonvolatile memory ICs.

An alternative configuration is to modify the current nonvolatile memory as shown in FIG. 3, in which an expandable memory IC 50 is substantially the same as the conventional nonvolatile memory shown in FIG. 1, and includes a control unit 52, a voltage generator 54 and a nonvolatile memory circuit 56. Similar to the nonvolatile memory circuit 10, the nonvolatile memory circuit 56 includes a memory array, an X decoder and driver, a Y decoder and driver, a Y pass gate, a sense amplifier and programming circuit, and an I/O buffer.

The difference of the expandable memory IC 50 from an ordinary nonvolatile memory IC is that the former comprises a plurality of expansion pins (not shown) to connect the control unit 52 and voltage generator 54 with other nonvolatile memory ICs 40a–x, that is, the control unit 52 and voltage generator 54 can be connected with the other nonvolatile memory ICs 40a–x by a selection circuit 57 and a voltage path 58 in addition to be utilized by the nonvolatile memory circuit 56 of the expandable memory 50 itself. Therefore, memory capacity expansion is achieved.

Figure 4:
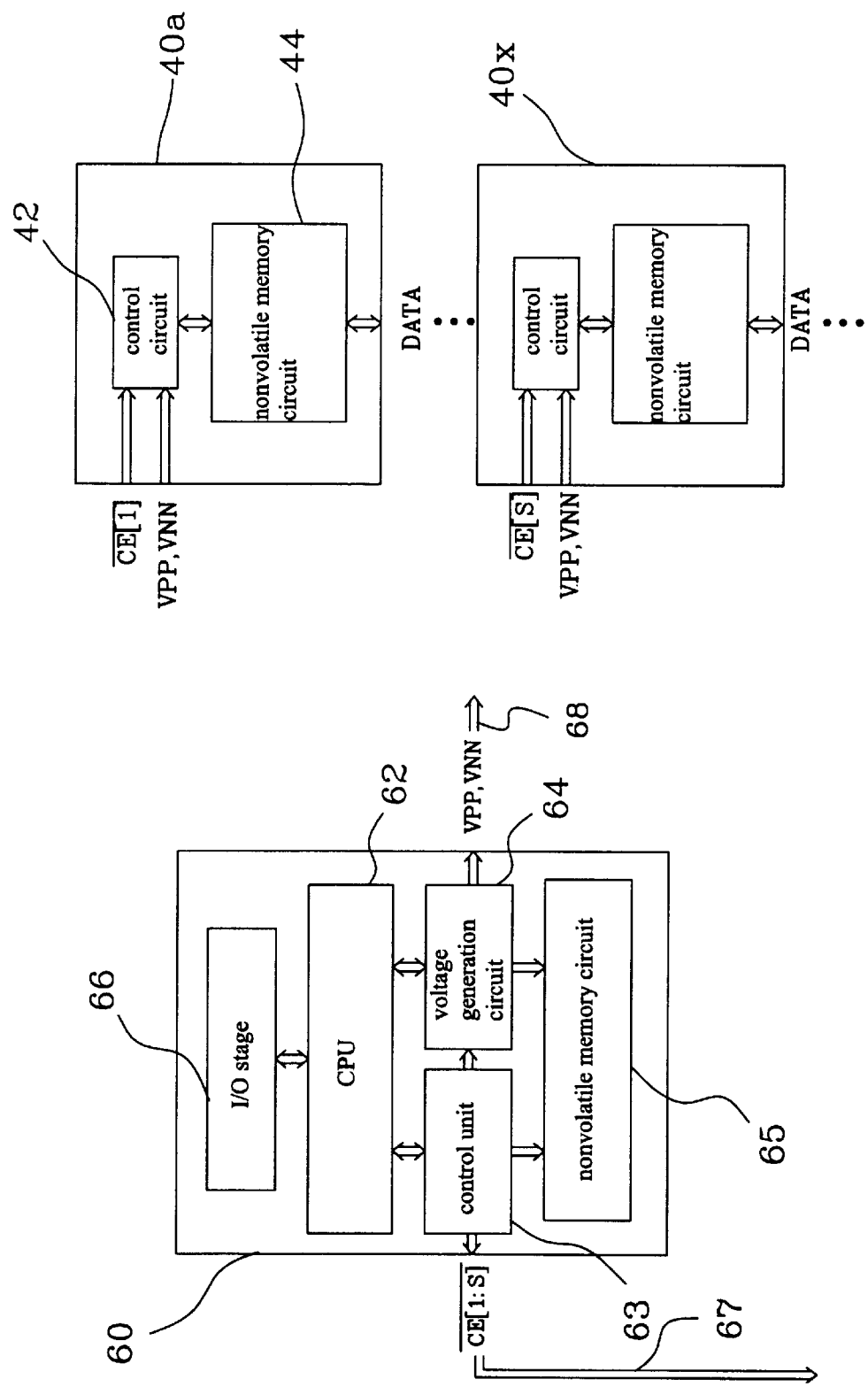
FIG. 4 shows an embodiment in which the present invention is practiced for a microcontroller or microcomputer with a control unit and a voltage generator thereof.

As shown in FIG. 3, a complete nonvolatile memory IC 50 is used for memory expansion in which the control unit 52 and voltage generator 54 in one nonvolatile memory IC 50 are shared by the other nonvolatile memory ICs 40a–x. In other applications, the nonvolatile memory ICs 40a–x can be provided with a control unit and a voltage generator by an IC device such as a microcontroller, microcomputer and digital signal processor (DSP) including the control unit and voltage generator thereof. For example, as shown in FIG. 4, an IC device 60 comprises a CPU 62, a control unit 63, a voltage generator 64, a nonvolatile memory circuit 65 and an I/O circuit 66. Similar to the nonvolatile memory circuit 10, the nonvolatile memory circuit 65 comprises a memory array, an X decoder and driver, a Y decoder and driver, a Y pass gate, a sense amplifier and programming circuit, and an I/O buffer.

The control unit 63 and voltage generator 64 can be connected with and shared by other nonvolatile memory ICs 40a–x by means of a selection circuit 67 and a voltage path 68 for memory capacity expansion. In other words, the IC device 60 has a plurality of expansion pins (not shown) to connect the control unit 63 and voltage generator 64 with the nonvolatile memory ICs 40a–x. The control unit 64 transmits a parallel selection signal CE[1:S] by the selection circuit 67 to select one of the nonvolatile memory ICs 40a–x, and the voltage generator 66 generates and transmits operation voltages to the nonvolatile memory IC 40a–x by the voltage path 68.

By sharing the control unit 63 and voltage generator 64 in the IC device 60, nonvolatile memory capacity available for the CPU 62 is adjustable, the maximum thereof is only restricted by the width of the selection signal CE[1:S]. As a result, not only the total chip area and the cost are decreased, but also production of microcontrollers or microcomputers with different memory capacity is unnecessary, and thus the products are standardized.

Figure 5:
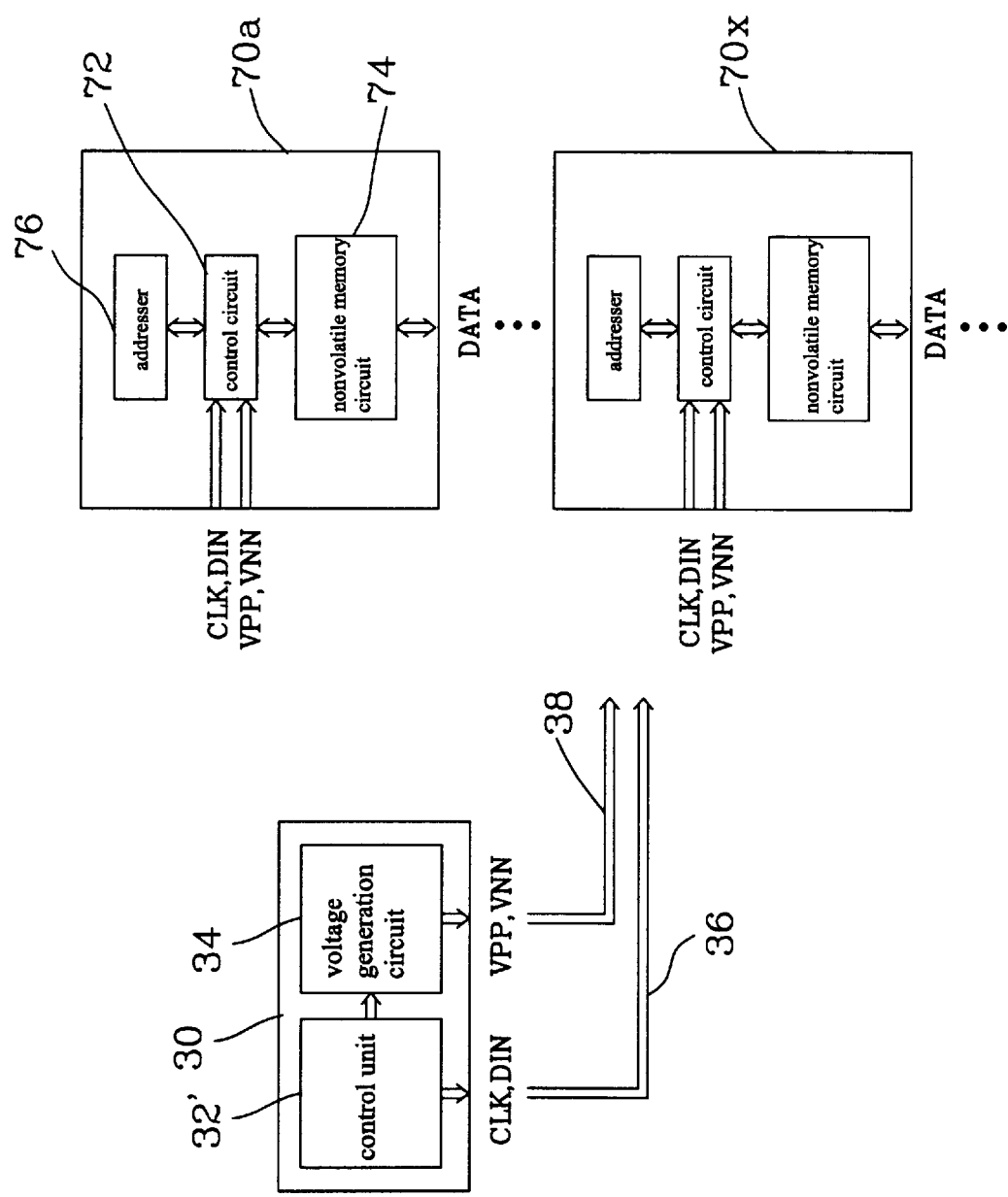
FIG. 5 is a view showing an embodiment in which the device shown in FIG. 2 selects one memory IC by a serial selection signal.
Figure 6:
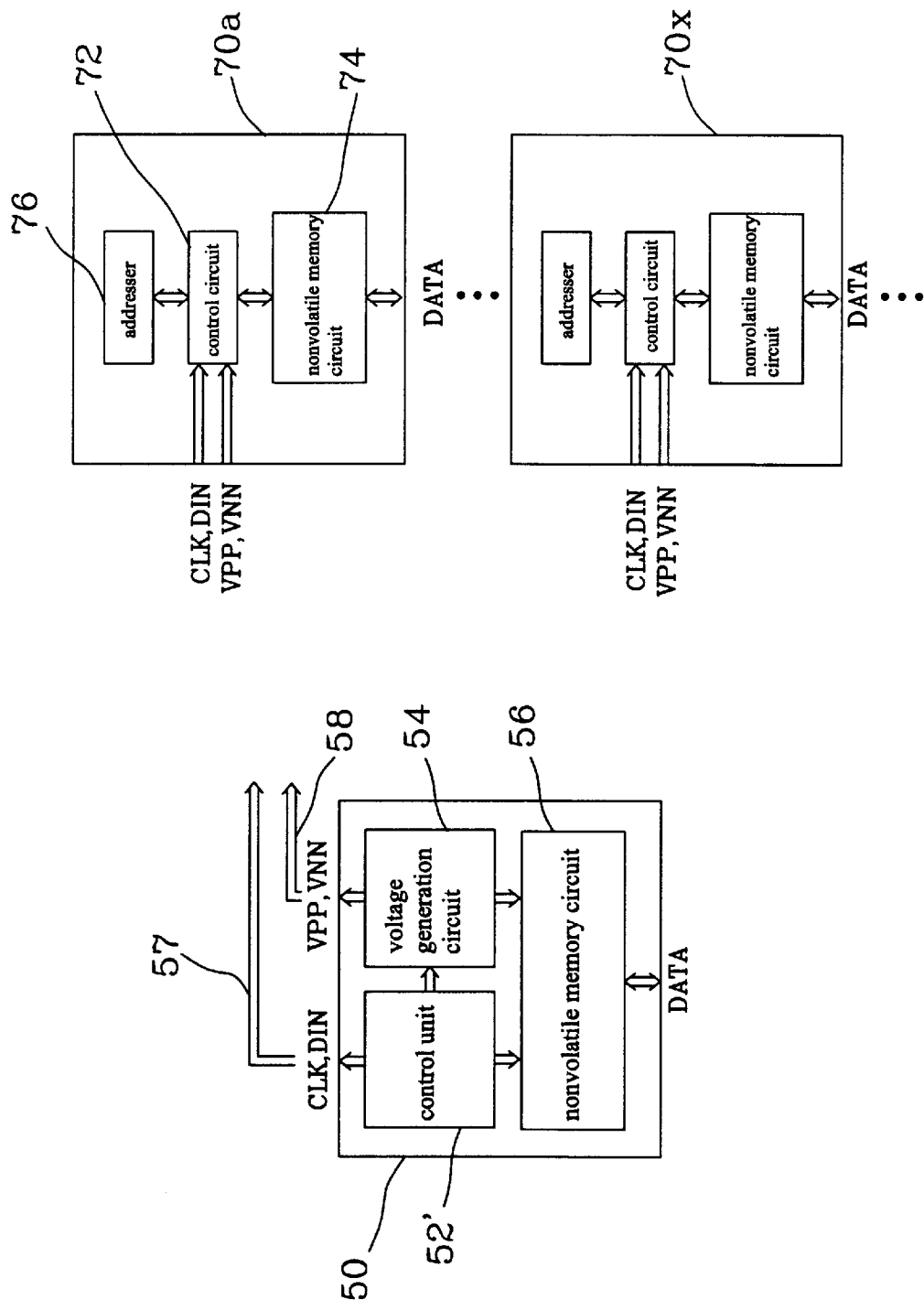
FIG. 6 is a view showing an embodiment in which the device shown in FIG. 3 selects one memory IC by a serial selection signal.
Figure 7:
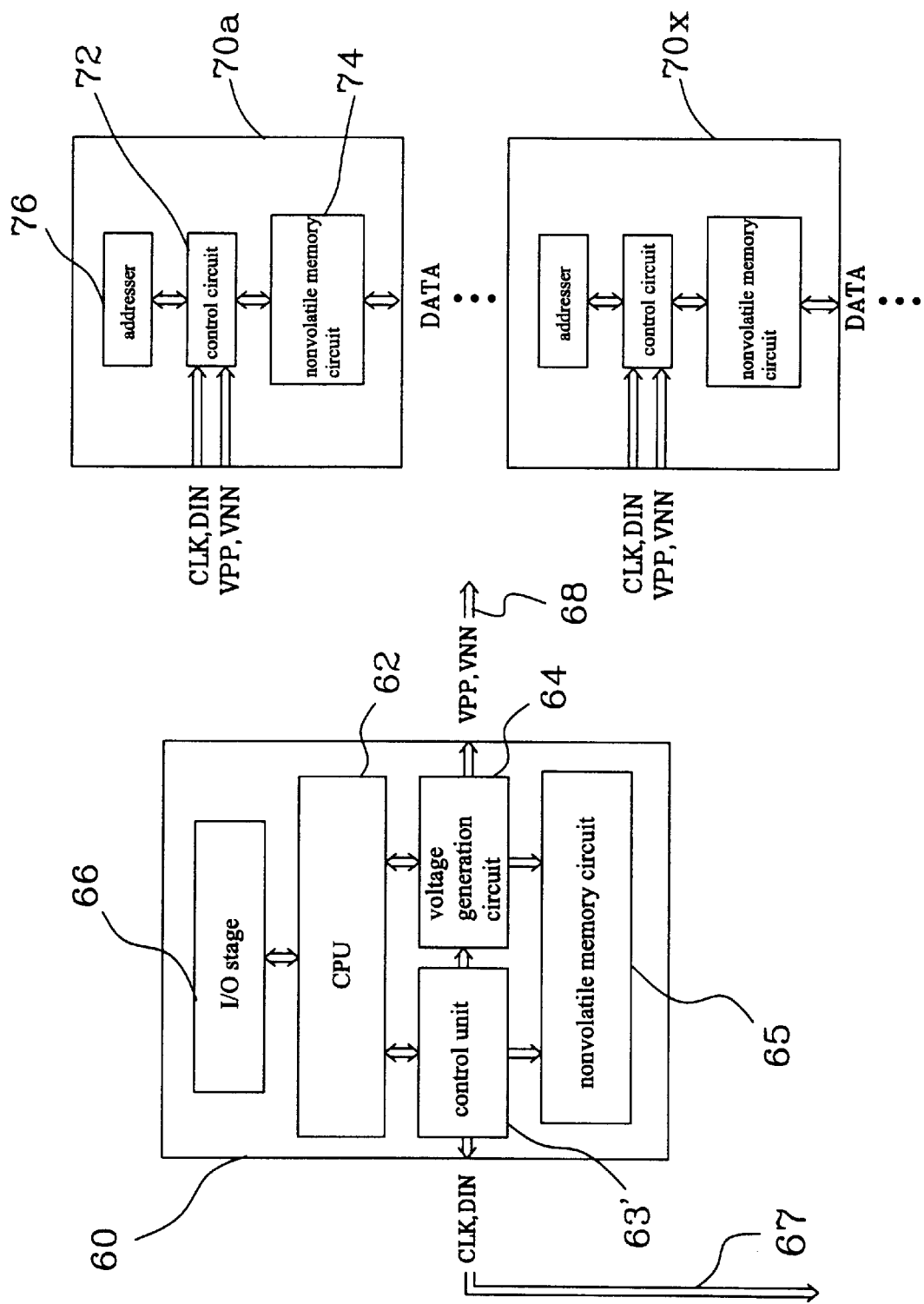
FIG. 7 is a view showing an embodiment in which the device shown in FIG. 4 selects one memory IC by a serial selection signal.

In the embodiments mentioned above, the parallel selection signal CE[1:S] is used to select one of the nonvolatile memory ICs 40a–x. In other embodiments, a serial selection signal can be used, for example, when the chip number is large. If a serial selection signal is used, FIGS. 2, 3 and 4 are revised as FIGS. 5, 6 and 7, respectively. As shown, nonvolatile memory ICs 70a–x each comprises a locator 76 in addition to a control circuit 72 and a nonvolatile memory circuit 74. The locator 76 is provided with an identification selection function. For example, an identification code is programmed in the locator 76. Namely, a specified identification code is programmed in each of the ICs 70a–x in advance, and a shared control unit 32', 52' or 63' transmits a clock signal CLK and a data signal DIN to the control circuits 72 in the ICs 70a–x by a selection circuit 36 in combination with the identification code in the locator 76 to select and enable the nonvolatile memory ICs 70a–x to be operated. Therefore, bus width of the selection circuit 36 is reduced, which decreases the I/O number of the control unit 32'.

The locator 76 mentioned above can be programmed with a one-time programming (OTP) memory, multi-time programming (MTP) memory or fuser, and an external element such as an external resistor can also be used, as long as it has the identification selection function. Besides, the serial selection circuit 36 in association with the locator 76 can comprise more than two lines for the clock signal CLK and data signal DIN. For example, three lines determine 8 addresses ($2^3=8$).

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An IC device with expandable nonvolatile memory comprising:
    at least one nonvolatile memory IC having a control circuit and a nonvolatile memory circuit, the nonvolatile memory circuit including a memory array and its decoder and driver, and a sense amplifier and programming circuit and an I/O buffer for accessing data in the memory array;
    an external data bus connected with the I/O buffer of the nonvolatile memory IC; and
    a common circuit including a voltage generator for providing the nonvolatile memory IC with corresponding voltages and a shared control unit connected with the control circuit of the nonvolatile memory IC by a selection circuit.

2. The device according to claim 1, wherein the common circuit further comprises a central processing unit (CPU) connected with an internal nonvolatile memory circuit and an internal I/O buffer.

3. The device according to claim 2, wherein the common circuit is a microcontroller.

4. The device according to claim 2, wherein the common circuit is a microcomputer.

5. The device according to claim 2, wherein the common circuit is a digital signal processor.

6. The device according to claim 1, wherein the selection circuit selects the nonvolatile memory IC by a parallel selection signal.

7. The device according to claim 1, wherein the nonvolatile memory IC further comprises an locator with an identification code thereof, and the selection circuit selects the nonvolatile memory IC by a serial selection signal and the identification code.

8. The device according to claim 7, wherein the locator comprises a one-time programming (OTP) memory.

9. The device according to claim 7, wherein the locator comprises a multi-time. programming (MTP) memory.

10. The device according to claim 7, wherein the locator comprises a fuser.

11. The device according to claim 7, wherein the locator comprises an external element.

12. The device according to claim 7, wherein the serial selection signal comprises a clock signal and a data signal.

13. The device according to claim 1, wherein the nonvolatile memory IC is a flash memory.

14. The device according to claim 1, wherein the nonvolatile memory IC is an EEPROM.

15. The device according to claim 1, wherein the nonvolatile memory IC is a MTP memory.

16. The device according to claim 1, wherein the common circuit further comprises an internal memory array and its decoder and driver, and a sense amplifier and programming circuit and an internal I/O buffer for accessing data in the internal memory array.

17. The device according to claim 16, wherein the common circuit is a flash memory.

18. The device according to claim 16, wherein the common circuit is an EEPROM.

19. The device according to claim 16, wherein the common circuit is a MTP memory.

20. An IC device with expandable nonvolatile memory comprising:
    a nonvolatile memory array;
    a decoder and driver for selecting a memory cell in the memory array;
    a sense amplifier and programming circuit for accessing data in the memory array;
    an I/O buffer serving as an I/O interface between the memory array and exterior;
    a control unit for generating various signals for the memory array when reading data and in programming; and
    a voltage generator for providing the nonvolatile memory array with corresponding voltages;
    the device being characterized by further comprising a plurality of extension pins being connected with the control unit and voltage generator for connecting to other nonvolatile memories.

21. The device according to claim 20, wherein the control unit of the IC device is connected with another nonvolatile memory by a selection circuit, and the control unit generates a parallel selection signal to select the another nonvolatile memory.

22. The device according to claim 20, wherein the control unit of the IC device is connected with another nonvolatile memory by a selection circuit, and the control unit generates a serial selection signal to select the another nonvolatile memory.

23. The device according to claim 22, wherein the serial selection signal comprises a clock signal and a data signal.

24. The device according to claim 20, wherein the nonvolatile memory array is a flash memory.

25. The device according to claim 20, wherein the nonvolatile memory array is an EEPROM.

26. The device according to claim 20, wherein the nonvolatile memory array is a MTP memory.

27. An IC device with expandable nonvolatile memory including a CPU and an I/O circuit, the IC device comprising:
    a nonvolatile memory circuit including:
        a nonvolatile memory array;
        a decoder and driver for selecting a memory cell in the memory array;
        a sense amplifier and programming circuit for accessing data in the memory array; and
        an I/O buffer serving as an I/O interface between the memory array and exterior;
    a control unit for generating various signals for the memory array when reading data and in programming; and
    a voltage generator for providing the nonvolatile memory array with corresponding voltages;
    the device being characterized by further comprising a plurality of extension pins being connected with the control unit and voltage generator for connecting to other nonvolatile memories.

28. The device according to claim 27, wherein the IC device is a microcontroller.

29. The device according to claim 27, wherein the IC device is a microcomputer.

30. The device according to claim 27, wherein the IC device is a digital signal processor.

31. The device according to claim 27, wherein the nonvolatile memory array is a flash memory.

32. The device according to claim 27, wherein the nonvolatile memory array is an EEPROM.

33. The device according to claim 27, wherein the nonvolatile memory array is a MTP memory.

34. The device according to claim 27, wherein the control unit of the IC device is connected with another nonvolatile memory by a selection circuit, and the control unit generates a parallel selection signal to select the another nonvolatile memory.

35. The device according to claim 27, wherein the control unit of the IC device is connected with another nonvolatile memory by a selection circuit, and the control unit generates a serial selection signal to select the another nonvolatile memory.

36. The device according to claim 35, wherein the serial selection signal comprises a clock signal and a data signal.

* * * * *